(12) United States Patent
Zhang et al.

(10) Patent No.: US 12,488,987 B2
(45) Date of Patent: Dec. 2, 2025

(54) VARIABLE SELECTIVE ETCHING TECHNOLOGY FOR THICK SOI DEVICES

(71) Applicant: University of Electronic Science and Technology of China, Chengdu (CN)

(72) Inventors: Bo Zhang, Chengdu (CN); Teng Liu, Chengdu (CN); Wentong Zhang, Chengdu (CN); Nailong He, Chengdu (CN); Sen Zhang, Chengdu (CN); Ming Qiao, Chengdu (CN); Zhaoji Li, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 469 days.

(21) Appl. No.: 18/121,609

(22) Filed: Mar. 15, 2023

(65) Prior Publication Data

US 2024/0112914 A1 Apr. 4, 2024

(30) Foreign Application Priority Data

Sep. 29, 2022 (CN) .......................... 202211199406.8

(51) Int. Cl.
*H01L 21/033* (2006.01)
*H01L 21/02* (2006.01)
*H01L 21/027* (2006.01)
*H01L 21/311* (2006.01)
*H01L 21/3205* (2006.01)
*H01L 21/3213* (2006.01)

(52) U.S. Cl.
CPC ...... *H01L 21/0337* (2013.01); *H01L 21/0217* (2013.01); *H01L 21/02274* (2013.01); *H01L 21/0273* (2013.01); *H01L 21/0332* (2013.01); *H01L 21/31116* (2013.01); *H01L 21/31138* (2013.01); *H01L 21/31144* (2013.01); *H01L 21/32055* (2013.01); *H01L 21/32137* (2013.01); *H01L 21/32139* (2013.01)

(58) Field of Classification Search
None
See application file for complete search history.

(56) References Cited

U.S. PATENT DOCUMENTS 5,770,484 A * 6/1998 Kleinhenz ............ H10B 12/395
257/E21.396
7,276,751 B2 * 10/2007 Ho ........................ H10D 1/042
438/386

(Continued)

*Primary Examiner* — Allan W. Olsen
(74) *Attorney, Agent, or Firm* — Bayramoglu Law Offices LLC (57) ABSTRACT

A new variable selective etching technology for thick SOI devices. An SOI material is etched by the following steps: (1) providing an SOI wafer; (2) depositing a composite hard mask with a variable selection ratio to replace a traditional hard mask with an invariable selection ratio; (3) applying a photoresist; (4) mask making, namely defining a to-be-etched region by using a photoetching plate; (5) etching the photoresist in the defined region; (6) etching the composite hard mask; (7) removing the photoresist; (8) etching top silicon by using a second etching method at a first selection ratio; and (9) etching a buried oxide layer by using a third etching method at a second selection ratio. The new variable selective etching technology avoids the damage to a side wall of a deep trench when the buried oxide layer is etched, and does not need to use an excessive thick hard mask.

9 Claims, 9 Drawing Sheets (56) References Cited

U.S. PATENT DOCUMENTS

2002/0146867 A1* 10/2002 Salvatore .......... H01L 21/76202
 438/149
2004/0147074 A1* 7/2004 Sell ..................... H10B 12/038
 257/E21.651
2005/0079724 A1* 4/2005 Ho ..................... H01L 21/3081
 257/E21.252
2009/0050932 A1* 2/2009 Lu ........................ H10D 86/201
 438/138

* cited by examiner

VARIABLE SELECTIVE ETCHING TECHNOLOGY FOR THICK SOI DEVICES

CROSS-REFERENCE TO THE RELATED APPLICATION

This application is based upon and claims priority to Chinese Patent Application No. 202211199406.8, filed on Sep. 29, 2022, the entire content of which is incorporated herein by reference.

TECHNICAL FIELD

The present invention relates to the field of semiconductor manufacturing, and in particular to a variable selective etching technology.

BACKGROUND

A silicon on insulator (SOI) high-voltage integrated circuit is widely applied due to the advantages of high speed, low power consumption, radiation resistance and easy isolation. The low vertical breakdown voltage of an SOI lateral device, serving as a core device of the SOI high-voltage integrated circuit, limits the application of the SOI lateral device in a high-voltage power integrated circuit. Numerous scholars at home and abroad have proposed a series of new structures to improve the vertical voltage resistance of the SOI lateral device, and a special deep trench structure requires etching a buried oxide layer of thick silicon on insulator. However, with the current available technology, a thick buried oxide layer cannot be etched on the premise of protecting the surface of a silicon wafer to be compatible with a BCD process.

SUMMARY

Base on the above reasons, an objective of the present invention is to provide a variable selective etching technology.

To achieve the above objective of the present invention, the technical solution of the present invention is as follows:
a variable selective etching technology is provided, wherein an SOI material is etched by the following steps:
providing an SOI wafer;
depositing a composite hard mask with a variable selection ratio to replace a traditional hard mask with an invariable selection ratio;
applying a photoresist;
mask making, namely defining a to-be-etched region by using a photomask;
etching the photoresist in the defined region;
etching the composite hard mask by using a first etching method;
removing the photoresist;
etching top silicon by using a second etching method at a first selection ratio;
etching a buried oxide layer by using a third etching method at a second selection ratio, wherein the second selection ratio is different from the first selection ratio.

As a preferred manner, in the SOI wafer, a thickness of the top silicon is thicker than 2 μm and thinner than 25 μm, and a thickness of the buried oxide layer is thicker than 0.5 μm and thinner than 4.5 μm.

As a preferred manner, the composite hard mask in the step (2) includes a first oxide layer, a silicon nitride layer, a second oxide layer, a polycrystalline silicon layer and a third oxide layer from bottom to top.

As a preferred manner, in the composite hard mask, the first oxide layer is obtained through thermal oxide growth, the silicon nitride layer is obtained through low pressure chemical vapor deposition, the second oxide layer is obtained through low pressure chemical vapor deposition, the polycrystalline silicon layer is obtained through low pressure chemical vapor deposition, and the third oxide layer is obtained through low pressure chemical vapor deposition.

As a preferred manner, the defined region in the step (5) is a ring, a long strip, a circular hole or a square hole.

As a preferred manner, in the step (6), the first etching method for etching the composite hard mask is: reactive ion etching is adopted, the pressure intensity is 30 to 300 mTorr, the power is 300 to 1000 W, and the gas flow is: $CF_4$ is 50 to 150 sccm and Ar is 10 to 150 sccm.

As a preferred manner, in the step (8), the second etching method for etching the top silicon is: reactive ion etching is adopted, the pressure intensity is 10 to 300 mTorr, the power is 300 to 1000 W, the gas flow is: $SF_6$ is 50 to 150 sccm and $O_2$ is 5 to 60 sccm, and after etching, a side wall is protected by a polymer or an oxide.

As a preferred manner, in the step (9), the third etching method for etching the buried oxide layer is: plasma or reactive ion etching is adopted, the pressure intensity is 30 to 300 mTorr, the power is 300 to 1000 W, the gas flow is: $CF_4$ is 5 to 80 sccm, Ar is 10 to 150 sccm, $CHF_3$ is 50 to 150 sccm and Ar is 10 to 150, and finally, the residual polymer is removed by wet rinsing.

As a preferred manner, the first selection ratio is greater than 20, and the second selection ratio is greater than 50. This can ensure that the silicon wafer is not damaged too much during etching so as to avoid the interface traps.

As a preferred manner, the first selection ratio is 35, and the second selection ratio is 100.

In one embodiment, the first etching method is reactive ion etching with high anisotropy and capable of etching the oxide layer, the silicon nitride and the polycrystalline silicon at the same time.

In one embodiment, the second etching method is fluoro-gas reactive ion etching with strong anisotropy and with a selection ratio of the oxide layer to silicon greater than 20.

In one embodiment, the third etching method is: a gas is introduced first to generate a silicon side wall protector, the third oxide layer is removed through plasma etching, and then wet etching with a great selection ratio of the oxide layer to the silicon and strong isotropy is used.

The beneficial effects of the present invention are: according to the present invention, damage to the side wall of the deep trench can be avoided when the buried oxide layer is etched, and an excessively thick hard mask is not required when the buried oxide layer with the thickness of more than 0.5 μm is etched, so that the cost of the process is reduced, the stress of the mask is relieved, and the stability of the process is improved.

BRIEF DESCRIPTION OF THE DRAWINGS

The above and other objectives, features and advantages of the present invention will become clearer from the more specific description of the preferred embodiments of the present invention shown in the accompanying drawings. The same reference numerals in all the drawings indicate the same part, and the drawings are not intentionally scaled to the actual size. The point is to show the theme of the present invention.

101: substrate; 102: insulating layer; 103: oxygen buried layer; 104: deep trench; 105: silicon-on-insulating-layer wafer; 106: first oxide layer; 107: silicon nitride layer; 108: second oxide layer; 109: polycrystalline silicon layer; 110: third oxide layer; 111: photoresist.

DETAILED DESCRIPTION OF THE EMBODIMENTS

A process manufacturing method for enhancing a buried layer electric field structure provided by the present invention is further described in detail below with reference to the accompanying drawings and specific embodiments. The advantages and features of the present invention will be clearer according to the following description and claims. It should be noted that the accompanying drawings all adopt very simplified forms and use inaccurate scales, which are only used for conveniently and clearly assisting in describing the objective of the embodiment of the present invention.

Embodiment 1

This embodiment provides a variable selective etching technology. AN SOI material is etched by the following steps:

an SOI wafer was provided, wherein in the SOI wafer, a thickness of the top silicon was thicker than 2 μm and thinner than 25 μm, and a thickness of the buried oxide layer was thicker than 0.5 μm and thinner than 4.5 μm.

A composite hard mask with a variable selection ratio was deposited to replace a traditional hard mask with an invariable selection ratio, wherein the composite hard mask in the step (2) included a first oxide layer 106, a silicon nitride layer 107, a second oxide layer 108, a polycrystalline silicon layer 109 and a third oxide layer 110 from bottom to top. In the composite hard mask, the first oxide layer was obtained through thermal oxide growth, the silicon nitride layer was obtained through low pressure chemical vapor deposition, the second oxide layer was obtained through low pressure chemical vapor deposition, the polycrystalline silicon layer was obtained through low pressure chemical vapor deposition, and the third oxide layer was obtained through low pressure chemical vapor deposition.

A photoresist was applied.

Mask making was performed, namely a to-be-etched region was defined by using a photomask.

The photoresist was etched in the defined region, wherein the defined region in the step (5) was a ring, a long strip, a circular hole or a square hole.

The composite hard mask was etched by using a first etching method, wherein the first etching method for etching the composite hard mask was: reactive ion etching was adopted, the pressure intensity was 30 to 300 mTorr, the power was 300 to 1000 W, and the gas flow was: $CF_4$ was 50 to 150 sccm and Ar was 10 to 150 sccm.

The photoresist was removed.

Top silicon was etched by using a second etching method at a first selection ratio, wherein the second etching method for etching the top silicon was: reactive ion etching was adopted, the pressure intensity was 10 to 300 mTorr, the power was 300 to 1000 W, the gas flow was: $SF_6$ was 50 to 150 sccm and $O_2$ was 5 to 60 sccm. After etching, a side wall was protected by a polymer or an oxide.

A buried oxide layer was etched by using a third etching method at a second selection ratio, wherein the second selection ratio was different from the first selection ratio. In the step (9), the third etching method for etching the buried oxide layer was: plasma or reactive ion etching was adopted, the pressure intensity was 30 to 300 mTorr, the power was 300 to 1000 W, the gas flow was: $CF_4$ was 5 to 80 sccm, Ar was 10 to 150 sccm, $CHF_3$ was 50 to 150 sccm and Ar was 10 to 150. Finally, the residual polymer was removed by wet rinsing.

Embodiment 2

Figure 1:
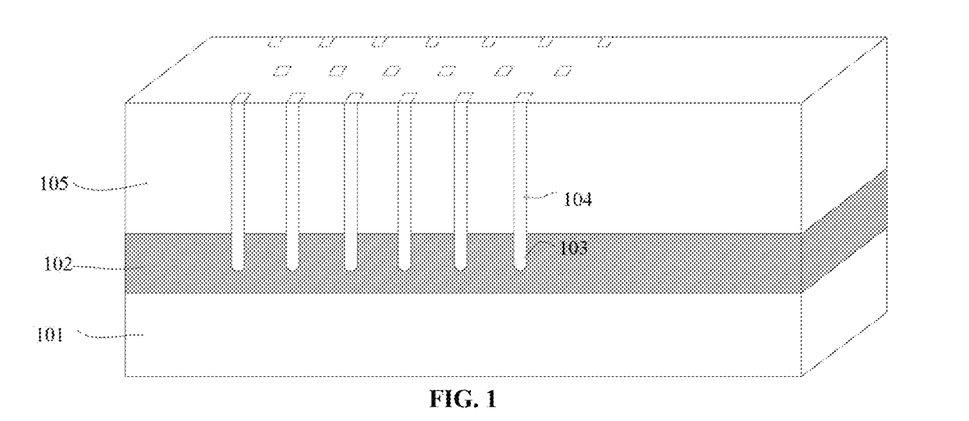
FIG. 1 is a perspective view after an SOI material in Embodiment 2 is etched.
Figure 2:
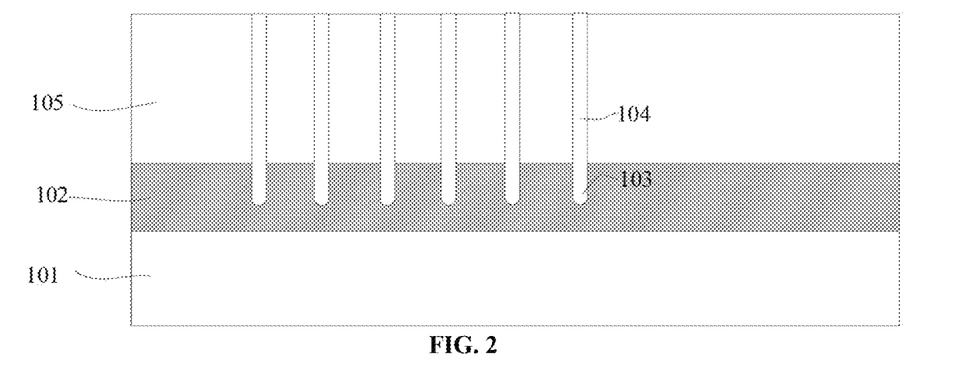
FIG. 2 is a front view after an SOI material in Embodiment 2 is etched.
Figure 3:
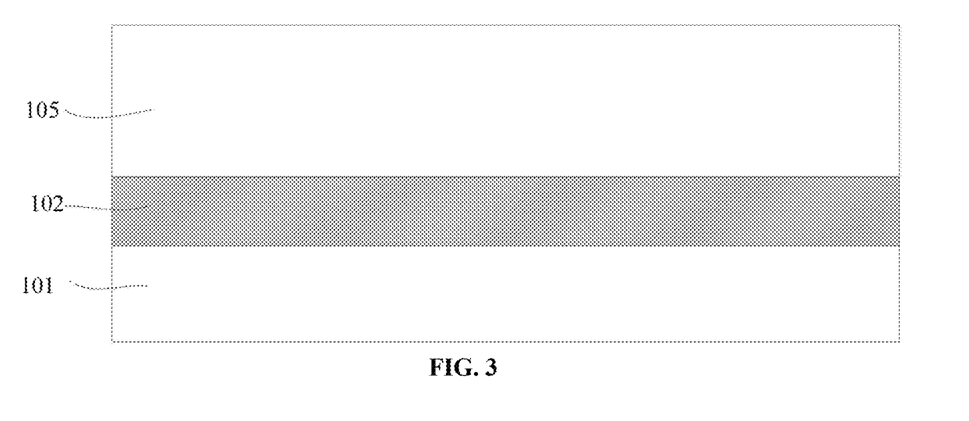
FIG. 3 is a schematic diagram of a wafer of silicon and silicon on insulating layer in Embodiment 2.

This embodiment provides a method for etching SOI at a variable selection ratio, including the following steps:

A substrate 101, an insulating layer 102 and a silicon-on-insulating-layer wafer 105 were provided, as shown in FIG. 3.

Figure 4:
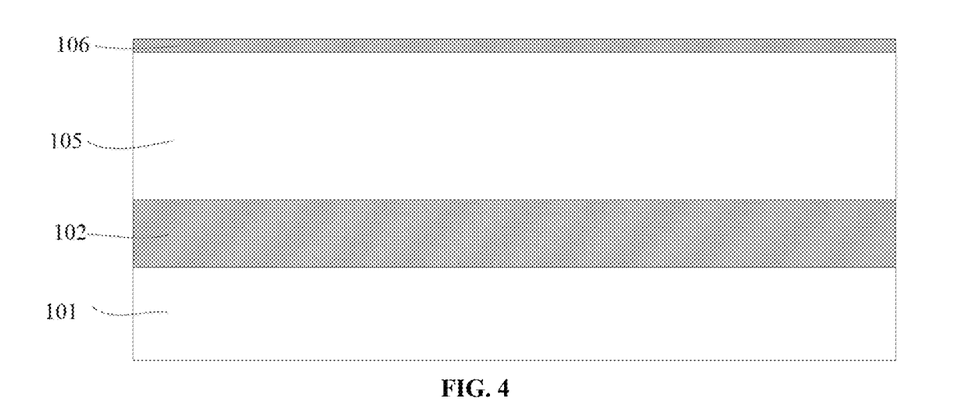
FIG. 4 is a schematic diagram of a first oxide layer in Embodiment 2.

A first oxide layer 106 with a certain thickness grew on the wafer through oxidation, as shown in FIG. 4, wherein this step adopted direct furnace tube oxide growth to improve the quality of the oxide layer and the surface defect stress of the silicon.

Figure 5:
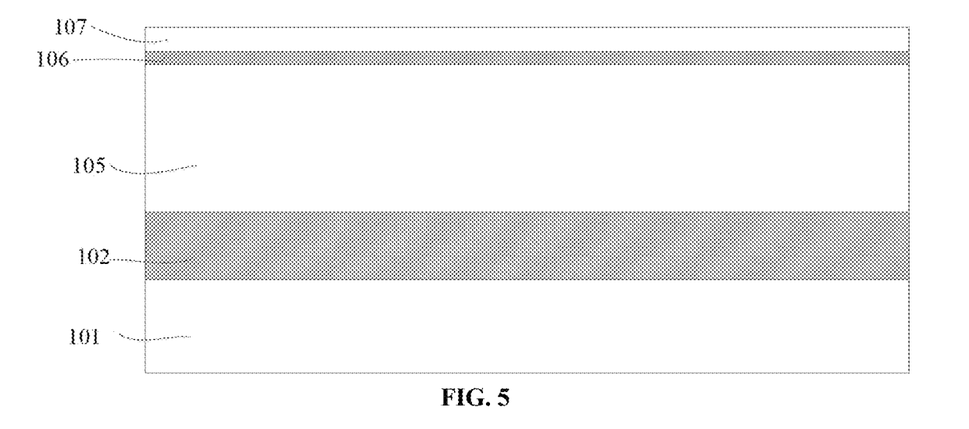
FIG. 5 is a schematic diagram of a silicon nitride layer in Embodiment 2.

A silicon nitride layer 107 with a certain thickness was deposited on the first oxide layer through low pressure chemical vapor deposition, as shown in FIG. 5, wherein low pressure chemical vapor deposition was adopted to facilitate the shaping of the silicon nitride and the uniformity of a silicon nitride film.

Figure 6:
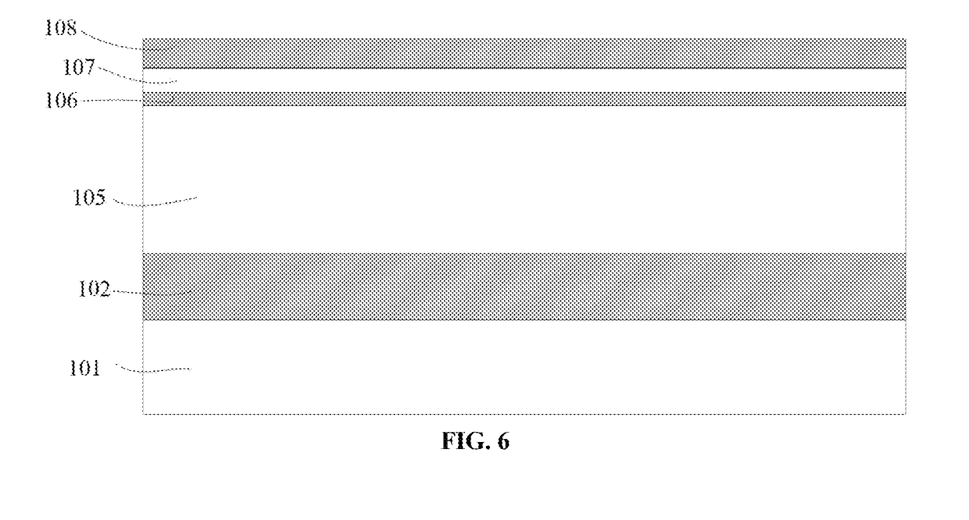
FIG. 6 is a schematic diagram of a second oxide layer in Embodiment 2.

A second oxide layer 108 with a certain thickness was deposited on the silicon nitride layer through low pressure chemical vapor deposition, as shown in FIG. 6, wherein low pressure chemical vapor deposition was adopted to facilitate the protection of the lower layer of silicon nitride.

Figure 7:
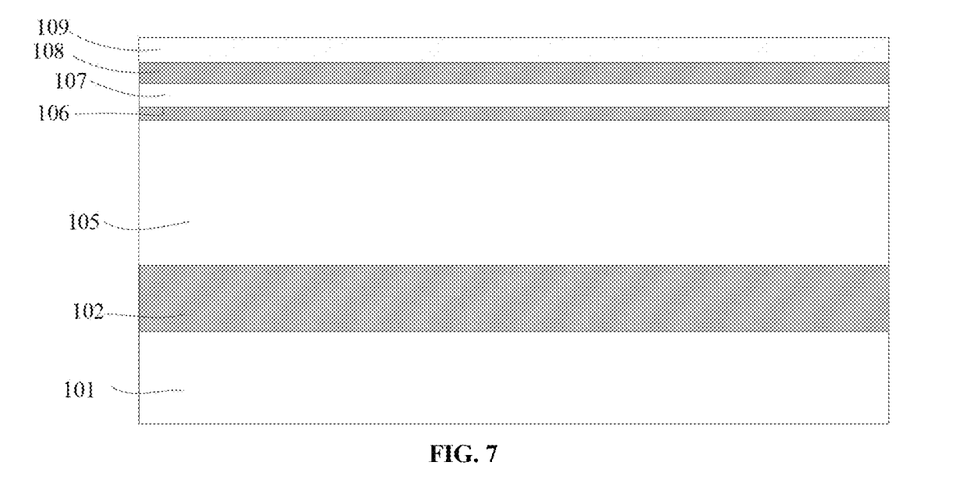
FIG. 7 is a schematic diagram of a polycrystalline silicon in Embodiment 2.

A polycrystalline silicon layer 109 with a certain thickness was deposited on the second oxide layer through low pressure chemical vapor deposition, as shown in FIG. 7, wherein this step played an important role in the etching of the buried oxide layer and adopted low pressure chemical vapor deposition.

Figure 8:
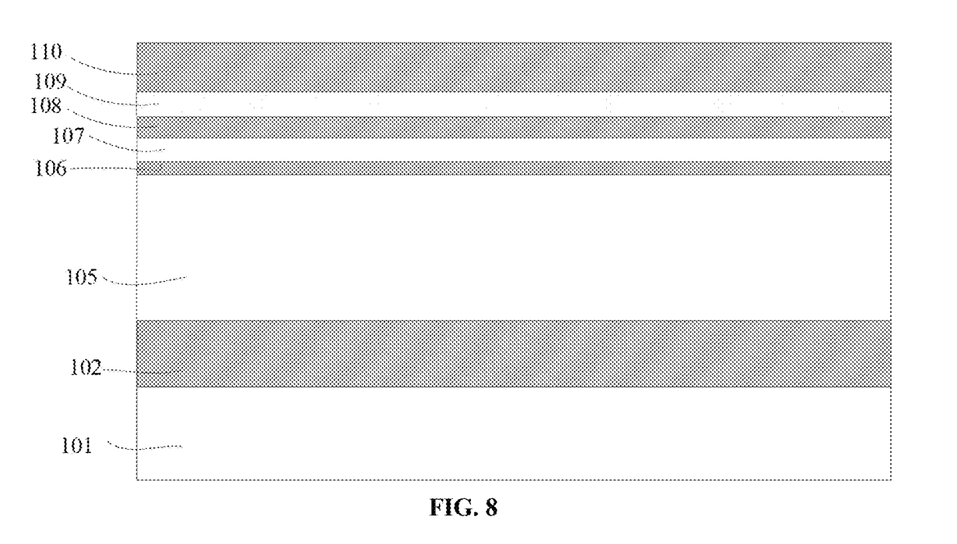
FIG. 8 is a schematic diagram of a third oxide layer in Embodiment 2.

A third oxide layer 110 with a certain thickness was deposited on the polycrystalline silicon layer through low pressure chemical vapor deposition, as shown in FIG. 8. Normal pressure, low pressure and plasma auxiliary chemical vapor deposition could be used.

Figure 9:
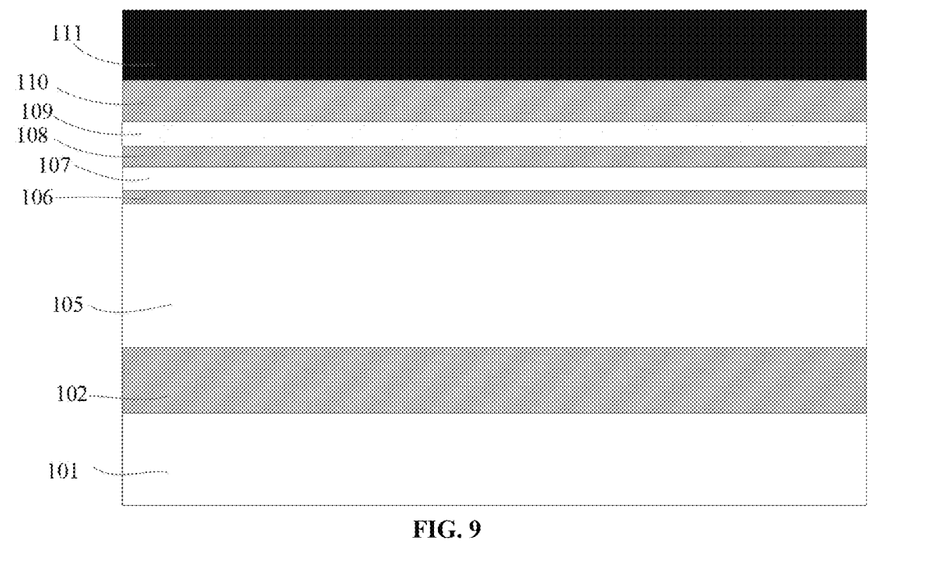
FIG. 9 is a schematic diagram of a photoresist in Embodiment 2.

A photoresist was applied, and the photoresist 111 with a thickness of about 1 micron was selected, as shown in FIG. 9.

Figure 10:
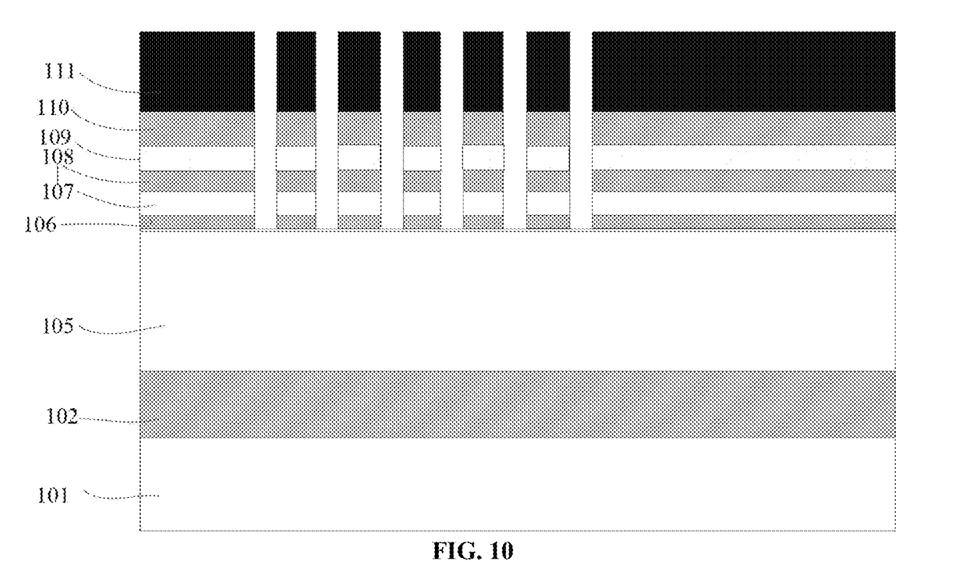
FIG. 10 is a schematic diagram using a first etching method in Embodiment 2.
Figure 16:
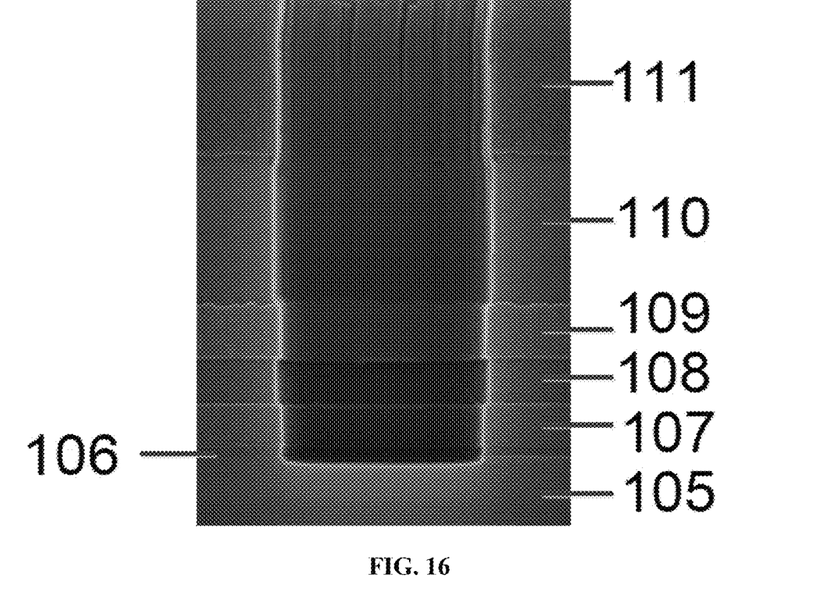
FIG. 16 is an SEM experimental diagram after a first etching method is used in Embodiment 2.

The silicon layer was photoetched by using a photoetching plate to define a region, and developing was performed, wherein the defined region was a ring, a long strip, a circular hole or a square hole. After developing, the composite hard mask was etched by using a first etching method, a deep trench 104 was etched to the surface of the silicon, as shown in the SEM experiments in FIG. 10 and FIG. 16, the selection ratio of the oxide layer and the silicon nitride to the silicon might not be too harsh, but the uniformity and the anisotropy should be ensured. Reactive ion etching was performed by a fluoro-gas dry method under the pressure intensity of 30 to 300 mTorr, the power of 300 to 1000 W and the gas ratio: CF4 being 50 to 150 sccm and Ar being 10 to 150 sccm, wherein the types of the gases included but were not limited to the above types. A certain selection ratio of the oxide layer to the silicon could be met by adjusting the oxygen content, and the anisotropy was controlled by adjusting the number of fluorine atoms and ion energy.

Figure 11:
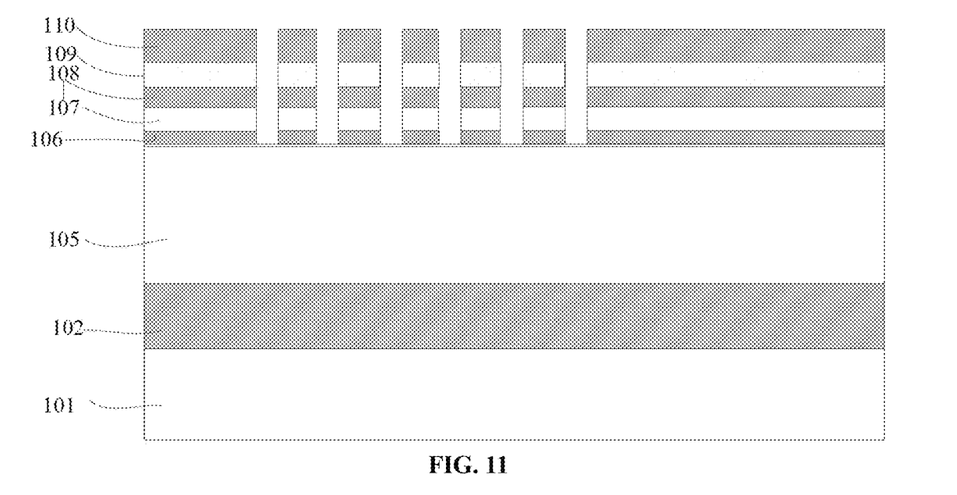
FIG. 11 is a schematic diagram after the photoresist is removed in Embodiment 2.

The photoresist was removed and cleaning was performed, as shown in FIG. 11.

Figure 12:
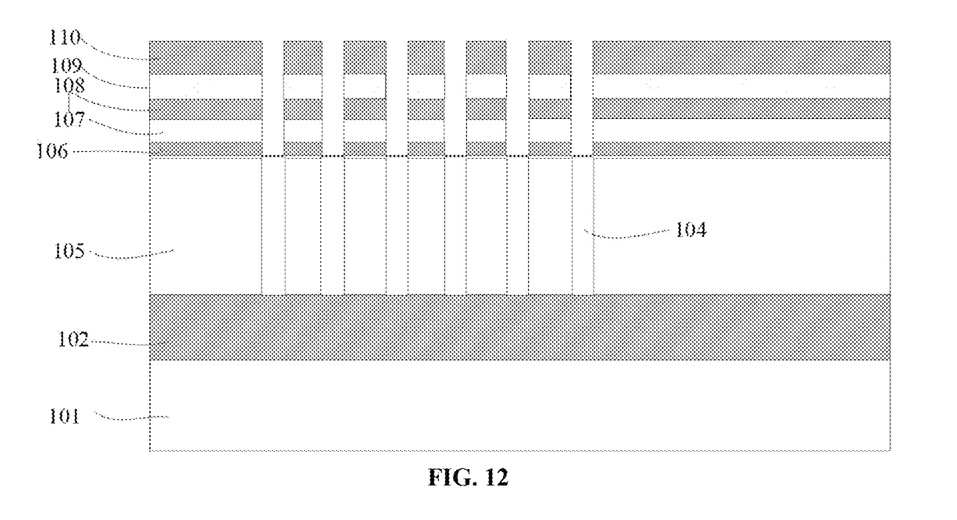
FIG. 12 is a schematic diagram after a second etching method is used in Embodiment 2.
Figure 17:
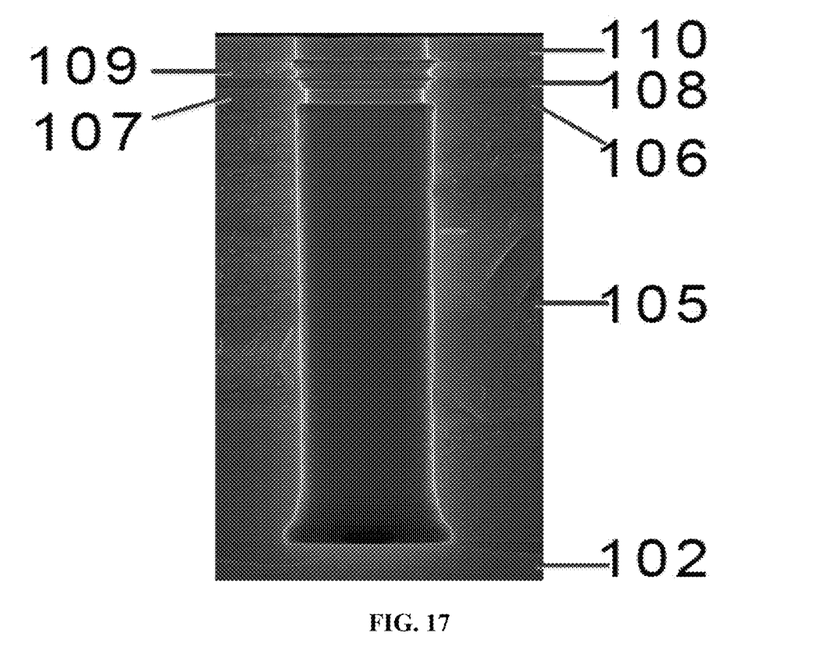
FIG. 17 is an SEM experimental diagram after a second etching method is used in Embodiment 2.
Figure 18:
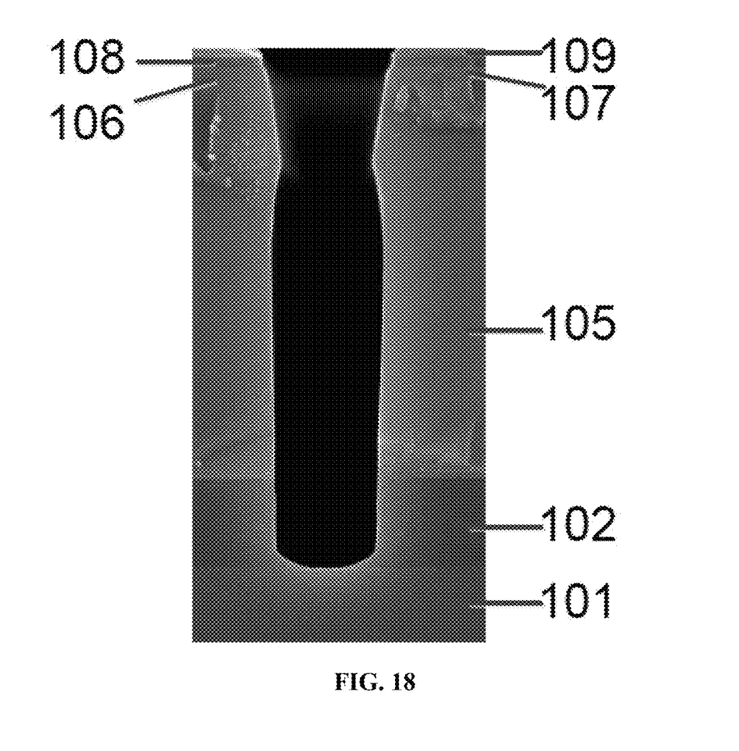
FIG. 18 is an SEM experimental diagram after a third etching method is used in Embodiment 2.
Figure 19:
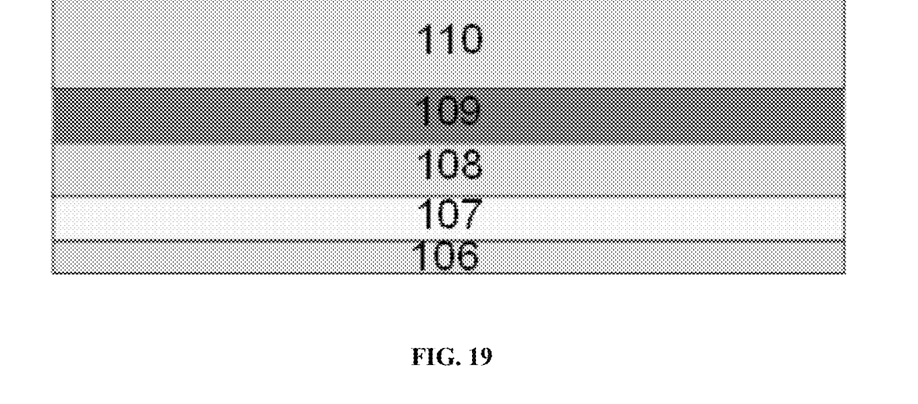
FIG. 19 is a schematic diagram of a composite hard mask with a variable selection ratio according to the present invention.
Figure 20:
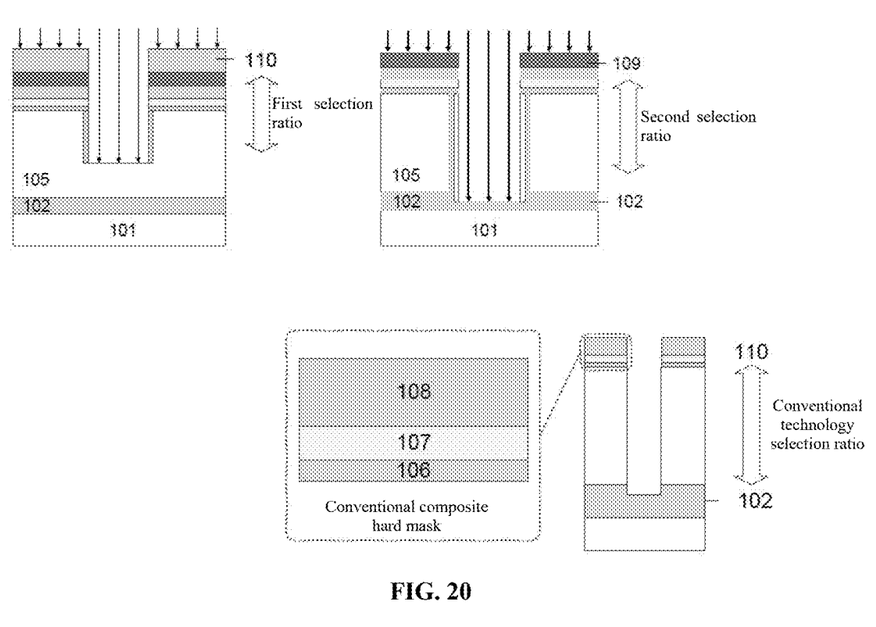
FIG. 20 is a schematic diagram using a first selection ratio, a second selection ratio and a conventional selection ratio according to the present invention.

Top silicon was etched by using a second etching method at a first selection ratio, wherein the second etching method was used for etching the top silicon under the pressure intensity of 10 to 300 mTorr, the power of 300 to 1000 W and the gas ratio: $SF_6$ being 50 to 150 sccm and $O_2$ being 5 to 60 sccm, and the types of the gases included but were not limited to the above types. The deep trench 104 was etched to an insulating layer 102, as shown in the SEM experiments in FIG. 12 and FIG. 17. In this step, the selection ratio of the silicon to the oxide layer was selected according to the top silicon. When the top silicon was thin, the selection ratio might not be too harsh. When the thickness of the top silicon is greater than 20 microns, it was best to ensure that the first selection ratio of the silicon to the oxide layer was greater than 20, and the ratio was 35 in this embodiment. Plasma etching was performed by a fluoro-gas, chlorine gas or bromine gas dry method. The first selection ratio of the silicon to the oxide layer could be met by adjusting the content of oxygen or hydrogen. The chlorine gas or bromine gas could ensure an extremely high anisotropy.

Figure 13:
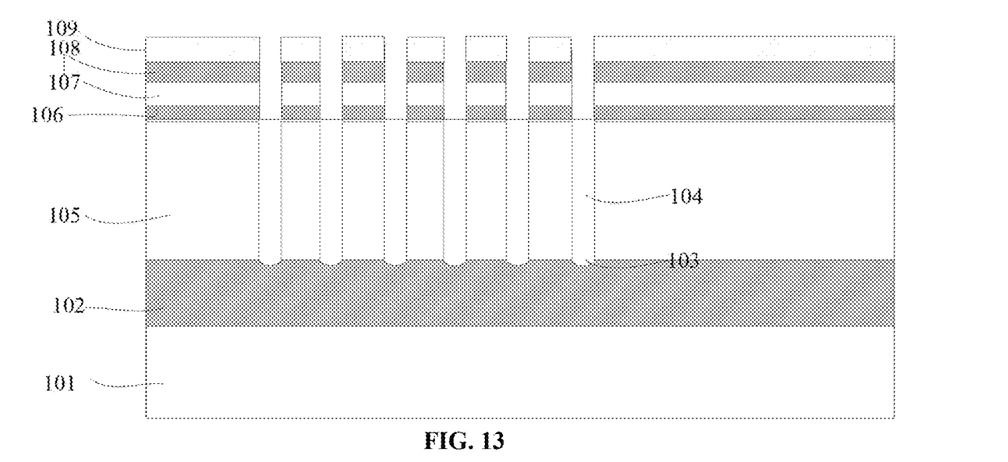
FIG. 13 is schematic diagram of buffer etching before a third etching method is used in Embodiment 2.
Figure 14:
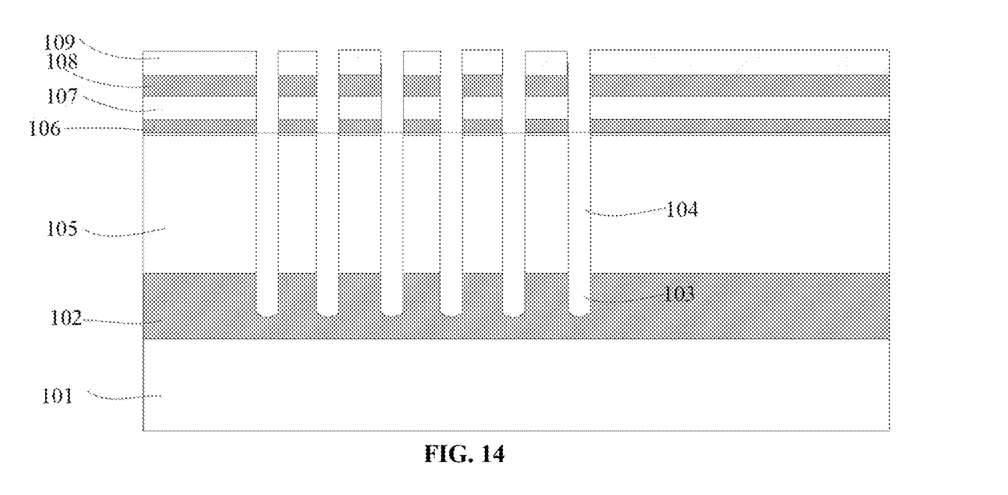
FIG. 14 is a schematic diagram after a third etching method is used in Embodiment 2.

A buried oxide layer was etched at a second selection ratio, as shown in FIG. 13. The selection ratio of the oxide layer to silicon nitride might not be too harsh, and the selection ratio of the hard mask to the silicon was not required. The main purpose was to remove the third oxide layer synchronously when the buried oxide layer was etched, so that the composite hard mask could be automatically converted. The second selection ratio was preferably greater than 50 and was 100 in this embodiment.

The third etching method for etching the buried oxide layer was: the pressure intensity was 30 to 300 mTorr, the power was 300 to 1000 W, and the gas flow: $CF_4$ was 5 to 80 sccm, Ar was 10 to 150 sccm, $CHF_3$ was 50 to 150 sccm, and Ar was 10 to 150, wherein the types of the gases included but were not limited to the above types. The buried oxide layer 103 was etched to a certain depth of the insulating layer 102, as shown in the SEM experiment in FIG. 14 to FIG. 18. At this time, the polycrystalline silicon layer in the composite hard mask played an important role. The selection ratio of the oxide layer to the silicon nitride might not be too harsh, but it should be ensured that the second selection ratio to the silicon had high uniformity and anisotropy. Plasma etching was performed by a fluoro-gas dry method. The content of hydrogen was adjusted. When the hydrogen concentration was greater than 40%, the etching rate of the silicon was almost 0. A certain selection ratio to the silicon nitride could be achieved by adjusting the ratio of oxygen/hydrogen. The anisotropy was controlled by adjusting the number of fluorine atoms and ion energy. Finally, for the side wall polymer after etching and the residues of the chemical reaction, etching could be accurately controlled by diluted hydrofluoric acid buffered with ammonium fluoride for wet etching. The etching process was stabilized, so that good isotropy and high selection ratio were achieved.

Figure 15:
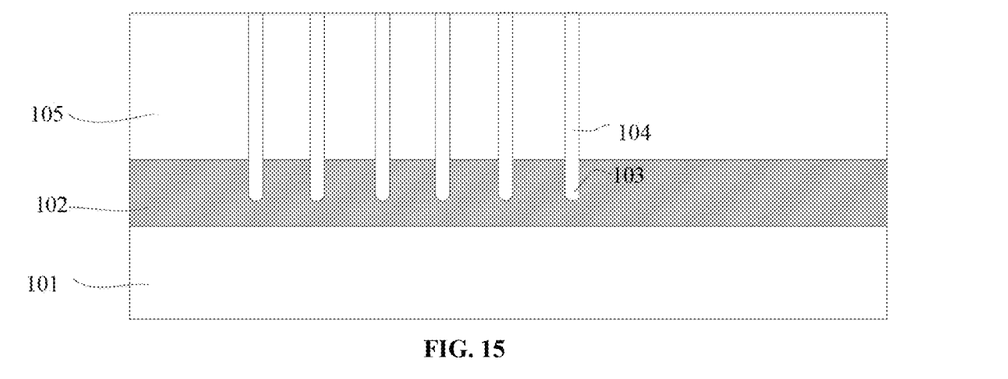
FIG. 15 is a schematic diagram after a composite hard mask is peeled off in Embodiment 2.

The composite hard mask was peeled off, as shown in FIG. 15. The polycrystalline layer was peeled off by dry etching. The silicon nitride layer was peeled off. Plasma dry etching was performed through thermal phosphoric acid or fluoro-gas plus oxygen/hydrogen. Diluted hydrofluoric acid buffered with ammonium fluoride was adopted.

What is claimed is:

1. A variable selective etching technology for SOI devices, wherein an SOI material is etched by the following steps:
    (1) providing an SOI wafer comprising a top silicon layer and a buried oxide layer disposed on a substrate;
    (2) depositing a composite hard mask with a variable selection ratio to replace a traditional hard mask with an invariable selection ratio;
    (3) applying a photoresist;
    (4) mask making by defining a to-be-etched region by using a photomask;
    (5) etching the photoresist in the defined region;
    (6) etching the composite hard mask by using a first etching method;
    (7) removing the photoresist;
    (8) etching top silicon by using a second etching method at a first selection ratio; and
    (9) etching the buried oxide layer by using a third etching method at a second selection ratio, the second selection ratio being different from the first selection ratio;
    wherein in the SOI wafer, a thickness of the top silicon layer is thicker than 2 μm and thinner than 25 μm, and a thickness of the buried oxide layer is thicker than 0.5 μm and thinner than 4.5 μm.

2. The variable selective etching technology for the SOI devices according to claim 1, wherein the defined region in the step (5) is a ring, a strip, a circular hole, or a square hole.

3. The variable selective etching technology for the SOI devices according to claim 1, wherein in the step (8), the second etching method for etching the top silicon is: reactive ion etching is adopted, the pressure intensity is 10 to 300 mTorr, the power is 300 to 1000 W, the gas flow is: SF6 is 50 to 150 sccm and $O_2$ is 5 to 60 sccm, and after etching, a side wall is protected by a polymer or an oxide.

4. The variable selective etching technology for the SOI devices according to claim 1, wherein in the step (9), the third etching method for etching the buried oxide layer is: plasma or reactive ion etching is adopted, the pressure intensity is 30 to 300 mTorr, the power is 300 to 1000 W, the gas flow is: CF4 is 5 to 80 sccm, Ar is 10 to 150 sccm, $CHF_3$ is 50 to 150 sccm, and finally, a residual polymer is removed by wet rinsing.

5. The variable selective etching technology for the SOI devices according to claim 1, wherein the first selection ratio is greater than 20, and the second selection ratio is greater than 50.

6. The variable selective etching technology for the SOI devices according to claim 1, wherein the first selection ratio is 35, and the second selection ratio is 100.

7. A variable selective etching technology for SOI devices, wherein an SOI material is etched by the following steps:
(1) providing an SOI wafer comprising a top silicon layer and a buried oxide layer disposed on a substrate;
(2) depositing a composite hard mask with a variable selection ratio to replace a traditional hard mask with an invariable selection ratio;
(3) applying a photoresist;
(4) mask making by defining a to-be-etched region by using a photomask;
(5) etching the photoresist in the defined region;
(6) etching the composite hard mask by using a first etching method;
(7) removing the photoresist;
(8) etching top silicon by using a second etching method at a first selection ratio; and
(9) etching the buried oxide layer by using a third etching method at a second selection ratio, the second selection ratio being different from the first selection ratio;
wherein the composite hard mask in the step (2) comprises a first oxide layer, a silicon nitride layer, a second oxide layer, a polycrystalline silicon layer, and a third oxide layer from bottom to top.

8. The variable selective etching technology for the SOI devices according to claim 7, wherein in the composite hard mask, the first oxide layer is obtained through thermal oxide growth, the silicon nitride layer is obtained through low pressure chemical vapor deposition, the second oxide layer is obtained through low pressure chemical vapor deposition, the polycrystalline silicon layer is obtained through low pressure chemical vapor deposition, and the third oxide layer is obtained through low pressure chemical vapor deposition.

9. A variable selective etching technology for SOI devices, wherein an SOI material is etched by the following steps:
(1) providing an SOI wafer comprising a top silicon layer and a buried oxide layer disposed on a substrate;
(2) depositing a composite hard mask with a variable selection ratio to replace a traditional hard mask with an invariable selection ratio;
(3) applying a photoresist;
(4) mask making by defining a to-be-etched region by using a photomask;
(5) etching the photoresist in the defined region;
(6) etching the composite hard mask by using a first etching method;
(7) removing the photoresist;
(8) etching top silicon by using a second etching method at a first selection ratio; and
(9) etching the buried oxide layer by using a third etching method at a second selection ratio, the second selection ratio being different from the first selection ratio;
wherein in the step (6), the first etching method for etching the composite hard mask is: reactive ion etching is adopted, the pressure intensity is 30 to 300 mTorr, the power is 300 to 1000 W, and the gas flow is: CF4 is 50 to 150 sccm and Ar is 10 to 150 sccm.

* * * * *